(12) United States Patent
Yim et al.

(10) Patent No.: US 9,576,848 B2
(45) Date of Patent: Feb. 21, 2017

(54) METHOD OF TREATING A POROUS DIELECTRIC LAYER AND A METHOD OF FABRICATING A SEMICONDUCTOR DEVICE USING THE SAME

(71) Applicant: Samsung Electronics Co., Ltd., Suwon-si (KR)

(72) Inventors: Taejin Yim, Suwon-si (KR); Thomas Oszinda, Suwon-si (KR); Byunghee Kim, Seoul (KR); Sanghoon Ahn, Goyang-si (KR); Naein Lee, Seoul (KR); Keeyoung Jun, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/847,130

(22) Filed: Sep. 8, 2015

(65) Prior Publication Data
US 2016/0148837 A1    May 26, 2016

(30) Foreign Application Priority Data

Nov. 25, 2014   (KR) .................. 10-2014-0165321

(51) Int. Cl.
*H01L 21/76*    (2006.01)
*H01L 21/768*   (2006.01)
*H01L 21/02*    (2006.01)

(52) U.S. Cl.
CPC ..... *H01L 21/76837* (2013.01); *H01L 21/0217* (2013.01); *H01L 21/0231* (2013.01); *H01L 21/02164* (2013.01); *H01L 21/02216* (2013.01); *H01L 21/02222* (2013.01); *H01L 21/02271* (2013.01); *H01L 21/76814* (2013.01); *H01L 21/76825* (2013.01); *H01L 21/76826* (2013.01); *H01L 21/76831* (2013.01); *H01L 21/76843* (2013.01)

(58) Field of Classification Search
CPC ................................. H01L 21/02107
See application file for complete search history.

(56) References Cited

U.S. PATENT DOCUMENTS

| | | | |
|---|---|---|---|
| 6,982,224 | B2 | 1/2006 | Cho |
| 7,157,373 | B2 | 1/2007 | Knorr et al. |
| 7,199,048 | B2 | 4/2007 | Chu et al. |
| 7,242,098 | B2 | 7/2007 | Abell |
| 7,442,756 | B2 | 10/2008 | Heiliger et al. |
| 7,456,490 | B2 | 11/2008 | Kloster et al. |
| 7,541,679 | B2 | 6/2009 | Cooney, III et al. |
| 7,553,769 | B2 | 6/2009 | Toma et al. |

(Continued)

FOREIGN PATENT DOCUMENTS

JP        2004-259753         9/2004

*Primary Examiner* — Fernando L Toledo
*Assistant Examiner* — Valerie N Newton
(74) *Attorney, Agent, or Firm* — Myers Bigel, P.A.

(57) ABSTRACT

A method of treating a porous dielectric layer includes preparing a substrate on which the porous dielectric layer including an opening and pores exposed by the opening is formed, supplying a first precursor onto the substrate to form a first sub-sealing layer sealing the exposed pores, and supplying a second precursor onto the first sub-sealing layer to form a second sub-sealing layer covering the first sub-sealing layer. Each of the first and second precursors includes silicon, and a molecular weight of the second precursor is smaller than that of the first precursor.

19 Claims, 8 Drawing Sheets

(56) References Cited

U.S. PATENT DOCUMENTS

| | | | |
|---|---|---|---|
| 7,678,682 B2 * | 3/2010 | Waldfried | C23C 16/56 |
| | | | 438/201 |
| 7,842,518 B2 | 11/2010 | Miyajima | |
| 7,947,579 B2 | 5/2011 | Jiang et al. | |
| 7,998,875 B2 | 8/2011 | DeYoung | |
| 8,415,255 B2 | 4/2013 | Sharma | |
| 8,492,170 B2 | 7/2013 | Xie et al. | |
| 8,586,485 B2 | 11/2013 | Lazovsky et al. | |
| 8,642,488 B2 | 2/2014 | Liu et al. | |
| 8,815,753 B2 | 8/2014 | Chiang et al. | |
| 8,968,864 B2 | 3/2015 | Goethals et al. | |
| 2013/0320520 A1 | 12/2013 | Michalak et al. | |

* cited by examiner

1200

METHOD OF TREATING A POROUS DIELECTRIC LAYER AND A METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. §119 to Korean Patent Application No. 10-2014-0165321, filed on Nov. 25, 2014, in the Korean Intellectual Property Office, the contents of which are herein incorporated by reference in their entirety.

BACKGROUND

1. Technical Field

The inventive concepts relate to a method of treating a porous dielectric layer and a method of fabricating a semiconductor device using the same. More particularly, the inventive concepts relate to a method of treating a low-k dielectric layer having a plurality of pores and a method of fabricating a semiconductor device using the same.

2. Description of the Related Art

As semiconductor devices have become highly integrated and capacity of semiconductor devices has increased, pitches of metal interconnections in semiconductor devices has been reduced. Thus, parasitic capacitances of semiconductor devices may be increased, so operation speeds of semiconductor devices may be reduced. To reduce the parasitic capacitances of semiconductor devices, various research is conducted for low-resistance copper interconnections and low-k dielectrics.

SUMMARY

Example embodiments of the inventive concepts may provide a method of treating a porous dielectric layer capable of reducing a dielectric constant.

Example embodiments of the inventive concepts may also provide a method of fabricating a semiconductor device capable of improving electrical characteristics.

In one aspect, a method of treating a porous dielectric layer may include: providing a substrate including the porous dielectric layer having an opening, the porous dielectric layer including a plurality of pores exposed by the opening; supplying a first precursor onto the substrate to form a first sub-sealing layer sealing the exposed pores; and supplying a second precursor onto the first sub-sealing layer to form a second sub-sealing layer covering the first sub-sealing layer. Each of the first and second precursors may include silicon, and a molecular weight of the second precursor may be smaller than that of the first precursor.

In an example embodiment, the first precursor may include a cyclosilazane-based material or a cyclosiloxane-based material, and the second precursor may include a silane-based material.

In an example embodiment, the first precursor may include a material expressed by the following chemical formula 1 when the first precursor includes the cyclosilazane-based material.

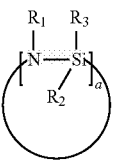

[Chemical formula 1]

In the chemical formula, "a" denotes an integer of 3 or 4, "R1" denotes hydrogen or a methyl group, and each of "R2" and "R3" independently denotes any one of an alkyl group having a carbon number of 1 to 6, an alkene group having a carbon number of 1 to 6, and an aryl group having a carbon number of 1 to 6.

In an example embodiment, the cyclosilazane-based material may include hexamethyl-cyclotrisilazane, octamethyl-cyclotetrasilazane, tetramethyl-tetravinyl-cyclotetrasilazane, or hexaphenyl-cyclotrisilazane.

In an example embodiment, the first precursor may include a material expressed by the following chemical formula 2 when the first precursor includes the cyclosiloxane-based material.

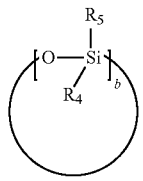

[Chemical formula 2]

In the chemical formula 2, "b" denotes an integer of 3 or 4, and each of "R4" and "R5" independently denotes any one of an alkyl group having a carbon number of 1 to 6, an alkene group having a carbon number of 1 to 6, and an aryl group having a carbon number of 1 to 6.

In an example embodiment, the cyclosiloxane-based material may include octamethyl-cyclotetrasiloxane, tetramethyl-tetraphenyl-cyclotetrasiloxane, or octaphenyl-cyclotetrasiloxane.

In an example embodiment, the silane-based material may include at least one of silane, disilane, methylsilane, dimethylsilane, trimethylsilane, or tetramethylsilane.

In an example embodiment, the first precursor may have a molecular weight of 200 to 800, and the second precursor may have a molecular weight of 100 or less.

In an example embodiment, the second precursor may be supplied by decomposing the first precursor.

In an example embodiment, the method may further include: performing a pre-treatment process on the substrate before the formation of the first sub-sealing layer. Performing the pre-treatment process may include: supplying a hydrogen-containing gas onto the substrate; and irradiating ultraviolet (UV) light onto the substrate.

In another aspect, a method of fabricating a semiconductor device may include: forming a porous dielectric layer having an opening on a substrate; forming a sealing layer in the opening; and forming a barrier layer in the opening having the sealing layer. Forming the sealing layer may include: performing a first sealing process using a first precursor on the substrate; and performing a second sealing process using a second precursor on the substrate after performing the first sealing process. The first precursor may include a cyclosilazane-based material or a cyclosiloxane-based material, and the second precursor may include a silicon-containing precursor having a molecular weight that is smaller than the molecular weight of the first precursor.

In an example embodiment, the cyclosilazane-based material may include hexamethyl-cyclotrisilazane, octamethyl-cyclotetrasilazane, tetramethyl-tetravinyl-cyclotetrasilazane, or hexaphenyl-cyclotrisilazane, and the cyclosiloxane-based material may include octamethyl-cyclotetrasiloxane, tetramethyl-tetraphenyl-cyclotetrasiloxane, or octaphenyl-cyclotetrasiloxane.

In an example embodiment, the silicon-containing precursor may include a precursor formed by decomposing the cyclosilazane-based material or a precursor formed by decomposing the cyclosiloxane-based material.

In an example embodiment, first precursor may have a molecular weight of in a range of 200 Daltons to 800 Daltons, and the second precursor may have a molecular weight of 100 Daltons or less.

In an example embodiment, the porous dielectric layer may include a plurality of pores exposed by the opening. The sealing layer may include: a first sub-sealing layer sealing the exposed pores; and a second sub-sealing layer covering the first sub-sealing layer. The first sub-sealing layer may be formed by the first sealing process, and the second sub-sealing layer is formed by the second sealing process.

In an example embodiment, before performing the first sealing process, the method may further include: performing a pre-treatment process. Performing the pre-treatment process may include: supplying a hydrogen-containing gas onto the substrate; and irradiating UV light onto the substrate. The pre-treatment process, the first sealing process, and the second sealing process may be performed in-situ in a same chamber.

In still another aspect, a method of treating a porous dielectric layer may include: preparing a substrate on which the porous dielectric layer having an opening is formed; performing a first sealing process using a first precursor on the substrate; and performing a second sealing process using a second precursor on the substrate. The first precursor may be an organic silicon precursor having a molecular weight in a range of 200 to 800 Daltons, and the second precursor may be a silicon-containing precursor having a molecular weight smaller than that of the first precursor.

In an example embodiment, the organic silicon precursor may include hexamethyl-cyclotrisilazane, octamethyl-cyclotetrasilazane, tetramethyl-tetravinyl-cyclotetrasilazane, hexaphenyl-cyclotrisilazane, octamethyl-cyclotetrasiloxane, tetramethyl-tetraphenyl-cyclotetrasiloxane, or octaphenyl-cyclotetrasiloxane. The silicon-containing precursor may include one or more of silane, disilane, methylsilane, dimethylsilane, trimethylsilane, and/or tetramethylsilane.

In an example embodiment, performing the second sealing process may further include: decomposing the first precursor using UV light or plasma power. In this case, the second precursor may include the decomposed first precursor.

In an example embodiment, the method may further include: performing a pre-treatment process before performing the first sealing process. Performing the pre-treatment process may include: supplying a hydrogen-containing gas onto the substrate; and irradiating UV light onto the substrate. The pre-treatment process, the first sealing process, and the second sealing process may be performed in-situ in a same chamber.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
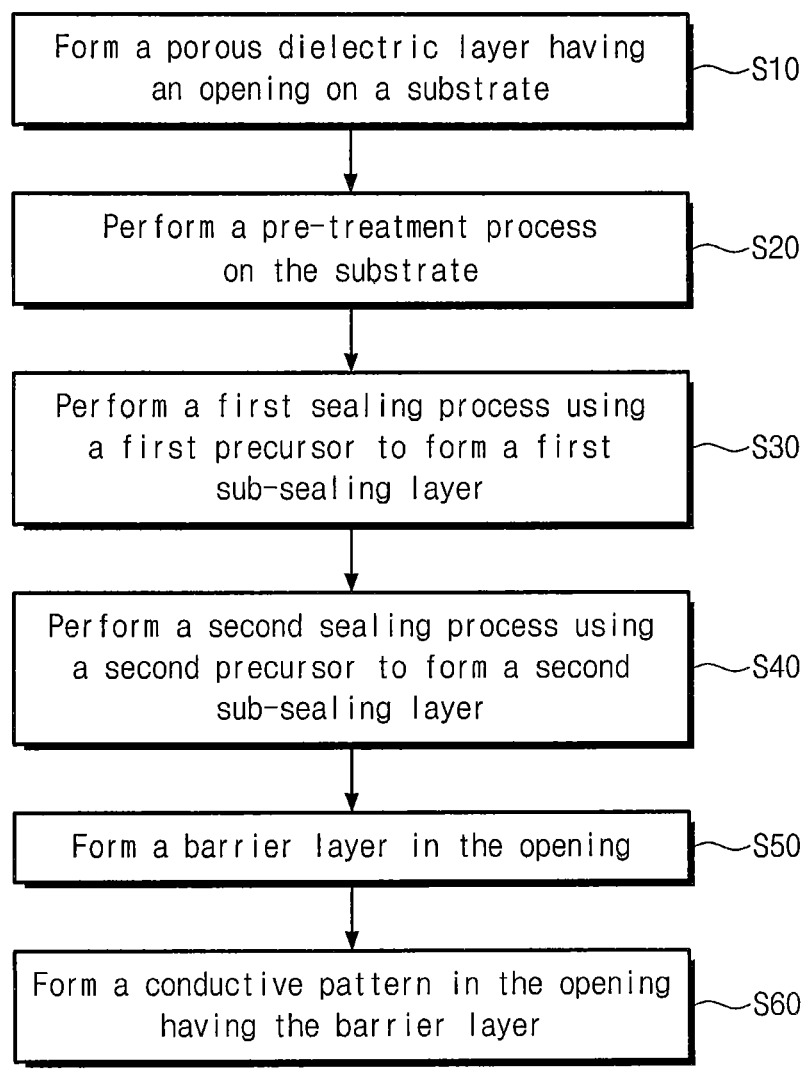
FIG. 1 is a flow chart illustrating a method of treating a porous dielectric layer and a method of fabricating a semiconductor device using the same according to example embodiments of the inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
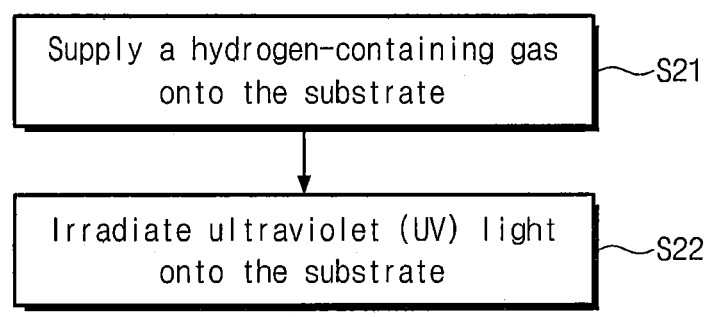
FIG. 2 is a flow chart illustrating a step S20 of FIG. 1 in detail.

FIG. 1 is a flow chart illustrating a method of treating a porous dielectric layer and a method of fabricating a semiconductor device using the same according to example embodiments of the inventive concepts. FIG. 2 is a flow chart illustrating a step S20 of FIG. 1 in detail. FIGS. 3A, 5A, 6, and 7 are cross-sectional views illustrating a method of treating a porous dielectric layer and a method of fabricating a semiconductor device using the same according to example embodiments of the inventive concepts. FIGS. 3B, 4A, and 4B are enlarged views corresponding to a portion 'A' of FIG. 3A. FIG. 5B is an enlarged view of a portion 'B' of FIG. 5A.

Figure 3A:
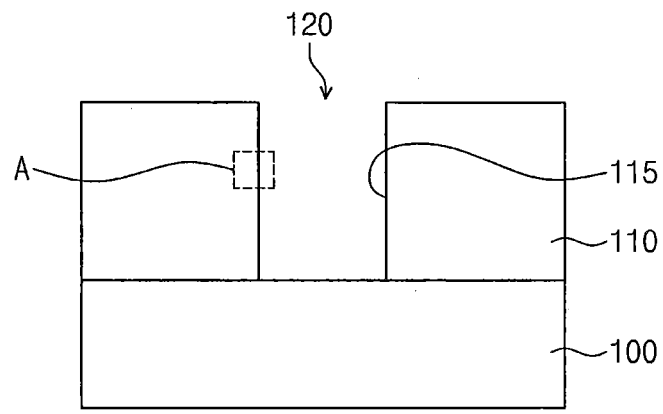
FIGS. 3A, 5A, 6, and 7 are cross-sectional views illustrating a method of treating a porous dielectric layer and a method of fabricating a semiconductor device using the same according to example embodiments of the inventive concepts.
Figure 3B:
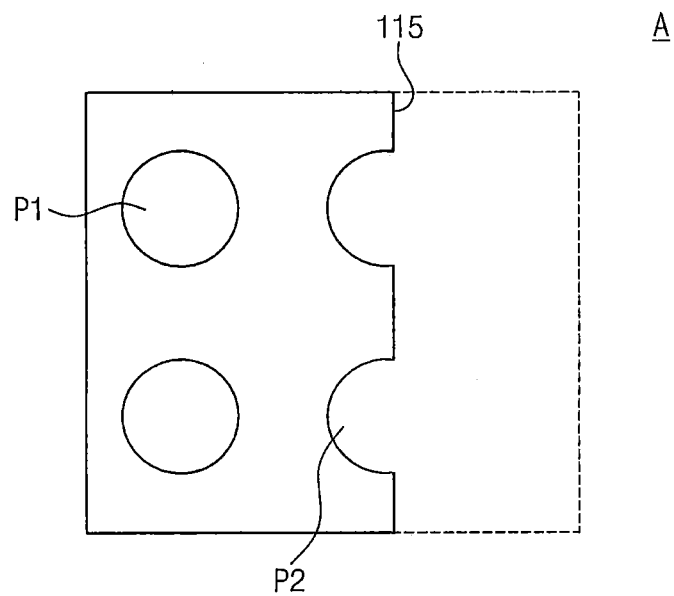
FIGS. 3B, 4A, and 4B are enlarged views corresponding to a portion 'A' of FIG. 3A.
Figure 4A:
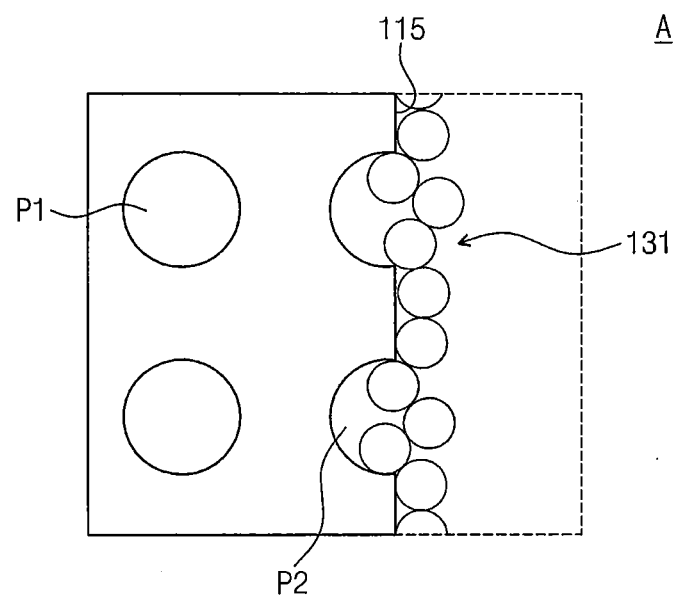
Figure 4B:
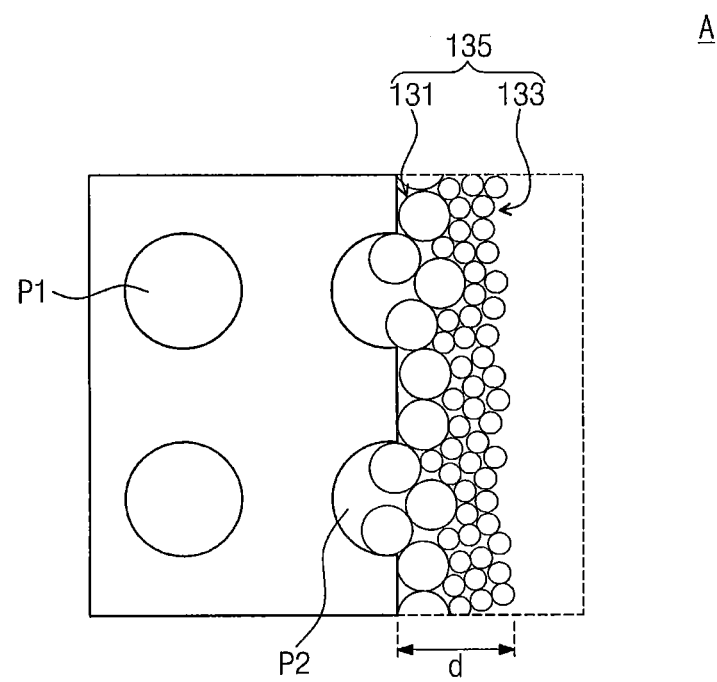

Referring to FIGS. 1, 3A, and 3B, a porous dielectric layer 110 having an opening 120 may be formed on a substrate 100 (S10). The substrate 100 may be, for example, a silicon (Si) substrate, a germanium (Ge) substrate, or a silicon-germanium (SiGe) substrate. However, the inventive concepts are not limited thereto. An integrated circuit including transistors and/or memory cells may be provided within the substrate 100. Even though not shown in the drawings, a contact, a metal interconnection, and/or an etch stop layer may be formed between the substrate 100 and the porous dielectric layer 110.

The porous dielectric layer 110 may be formed of a porous low-k material and may consist of one or more layers. The porous dielectric layer 110 may include, for example, a dielectric layer containing carbon and may have a plurality of pores P therein. Here, the pore may be a region not provided with a liquid material and/or a solid material. For example, the pore may correspond to a substantially empty space. In some embodiments, the porous dielectric layer 110 may be formed of a porous-SiOCH layer. The porous dielectric layer 110 may have an ultra low dielectric constant (ultra low-k; ULK) value. In some embodiments, the porous dielectric layer 110 may have a dielectric constant value of 1 to 2.55. The dielectric constant value of the porous dielectric layer 110 may be reduced as sizes of the pores P increases. In the present embodiment, the pores P may have a size (e.g., a diameter) of 1.5 nm to 5 nm. As illustrated in FIG. 3B, one or some of the pores P may be exposed by the opening 120. Hereinafter, for the purpose of ease and convenience in explanation, the pores exposed by the opening 120 may be defined as second pores P2 and other pores may be defined as first pores P1. Even though not shown in the drawings, some of the first and second pores P1 and P2 may be connected to each other.

According to an embodiment, after a dielectric layer including porogens (i.e., polymeric pore generators) may be formed by a deposition process (e.g., a chemical vapor deposition (CVD) process), a process for vaporizing the porogens may be performed on the dielectric layer to form the porous dielectric layer 110. The vaporizing process may include at least one of a thermal curing process, an ultra-violet (UV) curing process, or an e-beam curing process.

The opening 120 may have a via hole shape and/or a trench shape penetrating the porous dielectric layer 110. In an embodiment, the opening 120 may penetrate the porous dielectric layer 110 to expose the substrate. In another embodiment, if a metal interconnection (not shown) is formed between the porous dielectric layer 110 and the substrate 100, the opening 120 may expose the metal interconnection (not shown). According to an embodiment, a mask pattern (not shown) may be formed on the porous dielectric layer 110, and an anisotropic etching process may be performed using the mask pattern (not shown) as an etch mask to form the opening 120. The anisotropic etching process for the formation of the opening 120 may be performed using, for example, a plasma etching technique. The mask pattern (not shown) may include, for example, a photoresist material. The photoresist material may be removed by an ashing process and/or a strip process after the anisotropic etching process is completed. One opening 120 is illustrated in FIG. 3A for the purpose of ease and convenience in explanation. However, the inventive concepts are not limited thereto. In other embodiments, a plurality of openings 120 may be formed in the porous dielectric layer 110.

The processes (e.g., the plasma etching process and the ashing process and/or the strip process for the removal of the photoresist material) for the formation of the opening 120 may cause damage and/or contamination of the porous dielectric layer 110. The damage and/or contamination may act as a factor which increases the dielectric constant of the porous dielectric layer 110. For example, a carbon-containing portion (e.g., a methyl group (—$CH_3$)) of a surface (e.g., an inner sidewall 115) of the porous dielectric layer 110 may be eliminated by the plasma etching process. In this case, a Si—C bond of the surface of the porous dielectric layer 110 may be replaced with a Si—OH bond or group, and a water molecule ($H_2O$) may be easily bonded to the surface of the porous dielectric layer 110 which has the Si—OH group. Thus, the dielectric constant value of the porous dielectric layer 110 may increase. In addition, an undesired material (e.g., a water molecule or an etch residue) may permeate into the first pores P1 though the second pores P2 connected to the first pores P1. This phenomenon may also increase the dielectric constant value of the porous dielectric layer 110.

Meanwhile, a sealing process for sealing the second pores P2 may be performed to prevent another material from permeating into the first pores P1 during a subsequent process. However, as the sizes (e.g., diameters) of the pores P increase, a precursor for sealing the second pores P2 may permeate into the porous dielectric layer 110 through the second pores P2. Thus, the dielectric constant value of the porous dielectric layer 110 may increase and a surface roughness of a sealing layer may become worse.

A method of treating the porous dielectric layer 110 according to example embodiments of the inventive concepts may remove the water molecule and the residue of the surface and the inside of the porous dielectric layer 110, so the dielectric constant value of the porous dielectric layer 110 may be reduced. In addition, the treating method may inhibit the precursor from permeating into the porous dielectric layer 110 through the second pores P2 and may improve the surface roughness of the sealing layer. Hereinafter, the method will be described in more detail.

Referring to FIGS. 1, 2, 3A, 3B, 4A, and 4B, the method of treating the porous dielectric layer according to example embodiments may include performing a pre-treatment process (S20) and performing first and second sealing processes (S30 and S40).

First, the pre-treatment process of FIGS. 3A and 3B (S20). In detail, the pre-treatment process (S20) may include supplying a hydrogen-containing gas onto the substrate 100 including the porous dielectric layer 110 having the opening 120 (S21), and irradiating ultraviolet (UV) light (S22). In an embodiment, the UV light may be irradiated simultaneously with the supply of the hydrogen-containing gas or may be irradiated after the supply of the hydrogen-containing gas. For example, the hydrogen-containing gas may include at least one of hydrogen ($H_2$), ammonia ($NH_3$), or diazene ($N_2H_2$). The UV light may be irradiated in an atmosphere of an inert gas (e.g., nitrogen) or a vacuum for a time of 1 sec to 120 sec. The pre-treatment process (S20) may be performed at a temperature of 180° C. to 400° C. As a result, the water molecules and the residue may be removed from the surface and/or the inside of the porous dielectric layer 110.

Subsequently, the sealing process may be performed to seal the second pores P2 exposed by the opening 120. In some embodiments, the sealing process may be performed through two steps. In other words, performing the sealing process may include performing the first sealing process using a first precursor to form a first sub-sealing layer (S30), and performing the second sealing process using a second precursor to form a second sub-sealing layer (S40). According to an embodiment, the sealing process may be performed in-situ in a same chamber in which the pre-treatment process is performed. According to embodiments of the inventive concepts, each of the first and second precursors may include silicon, and the first precursor may have a molecular structure enlarged more than that of the second precursor. In other words, the molecular weight of the first precursor may be greater than that of the second precursor.

In more detail, performing the first sealing process (S30) may include supplying the first precursor onto the substrate 100. The first precursor may include an organic silicon precursor having a molecular weight in a range of 200 to 800 Daltons. For example, the first precursor may include a cyclosilazane-based material or a cyclosiloxane-based material. In particular, the first precursor may include a material expressed by the following chemical formula 1 or chemical formula 2.

[Chemical formula 1]

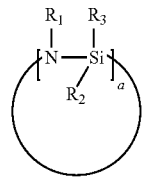

In the chemical formula 1, "a" denotes an integer of 3 or 4, "R1" denotes hydrogen or a methyl group, and each of "R2" and "R3" independently denotes any one of an alkyl group having a carbon number of 1 to 6, an alkene group having a carbon number of 1 to 6, and an aryl group having a carbon number of 6.

[Chemical formula 2]

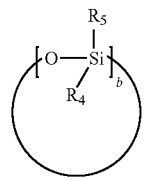

In the chemical formula 2, "b" denotes an integer of 3 or 4, and each of "R4" and "R5" independently denotes any one of an alkyl group having a carbon number of 1 to 6, an alkene group having a carbon number of 1 to 6, and an aryl group having a carbon number of 6.

For example, the cyclosilazane-based material expressed by the chemical formula 1 may include hexamethyl-cyclotrisilazane (this may be called hexamethyl-triazasilinane according to the IUPAC nomenclature system), octamethyl-cyclotetrasilazane (or octamethyl-tetrazatetrasilocane), tetramethyl-tetravinyl-cyclotetrasilazane (or tetramethyl-tetravinyl-tetrazasilocane), or hexaphenyl-cyclotrisilazane (or hexaphenyl-triazasilinane).

For example, the cyclosiloxane-based material expressed by the chemical formula 2 may include octamethyl-cyclotetrasiloxane (this may be called octamethyl-tetraoxatetrasilocane according to the IUPAC nomenclature system), tetramethyl-tetraphenyl-cyclotetrasiloxane (or tetramethyl-tetraphenyl-tetraoxatetrasilocane), or octaphenyl-cyclotetrasiloxane (or octaphenyl-tetraoxatetrasilocane).

The following table 1 shows names, molecular weights, and structural formulas of examples of materials of the first precursor.

TABLE 1

| Name of Material (IUPAC nomenclature system) | Molecular Weight | Structural Formula |
|---|---|---|
| 2,2,4,4,6,6-hexamethyl-1,3,5,2,4,6-triazatrisilinane | 219.51 | |
| 2,2,4,4,6,6,8,8-octamethyl-1,3,5,7,2,4,6,8-tetrazetetrasilocane | 292.68 | |
| 1,2,3,4,5,6,7,8-octamethyl-1,3,5,7,2,4,6,8-tetrazatetrasilocane | 292.68 | |
| 2,4,6,8-tetramethyl-2,4,6,8-tetravinyl-1,3,5,7,2,4,6,8-tetrazatetrasilocane | 340.72 | |
| 2,2,4,4,6,6-hexaphenyl-1,3,5,2,4,6-triazatrisilinane | 591.92 | |

TABLE 1-continued

| Name of Material (IUPAC nomenclature system) | Molecular Weight | Structural Formula |
| --- | --- | --- |
| 2,2,4,4,6,6,8,8-octamethyl-1,3,5,7,2,4,6,8-tetraoxatetrasilocane | 296.62 | |
| 2,4,6,8-tetramethyl-2,4,6,8-tetraphenyl-1,3,5,7,2,4,6,8-tetraoxatetrasilocane | 544.89 | |
| 2,2,4,4,6,6,8,8-octaphenyl-1,3,5,7,2,4,6,8-tetraoxatetrasilocane | 793.17 | |

The first sealing process (S30) may be performed under temperature and pressure conditions that the first precursor reacts with and is bonded to the surface of the porous dielectric layer 110. For example, the first sealing process (S30) may be performed at a temperature of 180° C. to 400° C. and a pressure of 1 Torr to 50 Torr.

Thus, the first precursor supplied on the substrate 100 may react with and be bonded to the surface (the inner sidewall 115 exposed by the opening 120) of the porous dielectric layer 110. For example, the first precursor including the organic silicon precursor may be bonded to the Si—OH group of the damaged surface of the porous dielectric layer 110. As a result, the first sub-sealing layer 131 may be formed to seal the second pores P2 exposed by the opening 120, as illustrated in FIG. 4A. For example, the first sub-sealing layer 131 may be formed of a substantial monolayer.

Next, the second sealing process may be performed (S40). Performing the second sealing process (S40) may include supplying the second precursor onto the substrate 100 having the first sub-sealing layer 131. The second precursor may include a silicon-containing precursor of which a molecular weight is smaller than that of the first precursor. A molecular structure of the second precursor may be smaller than that of the first precursor.

According to an embodiment, the second precursor may include at least one of silane, disilane, methylsilane, dimethylsilane, trimethylsilane, or tetramethylsilane. The second precursor may have a molecular weight of 100 or less. In this case, the second sealing process (S40) may be performed under the same temperature and pressure conditions as the first sealing process (S30).

According to another embodiment, the second precursor may be formed by decomposing the first precursor. In this case, performing the second sealing process (S40) may further include decomposing the first precursor. In some embodiments, the first precursor may be decomposed using UV light or plasma power (e.g., radio-frequency (RF) power). In an embodiment, decomposing the first precursor may include supplying the first precursor into a reaction chamber (not shown) in which the substrate 100 is loaded, and irradiating the UV light into the reaction chamber (not shown). In this case, the irradiation of the UV light may be performed at a temperature of 200° C. to 400° C. In another embodiment, decomposing the first precursor may include providing the plasma power (e.g., the RF power) into the reaction chamber (not shown) into which the first precursor is supplied. By the decomposing step, the alkyl group, the alkene group, or the aryl group of the first precursor may be eliminated or ring bonds of the first precursor may be broken. The decomposed first precursor may have a molecular structure smaller than that of the first precursor which is not decomposed.

The second precursor supplied on the substrate 100 having the first sub-sealing layer 131 may be bonded to a surface of the first sub-sealing layer 131, so a second sub-sealing layer 133 may be formed to cover the first sub-sealing layer 131 as illustrated in FIG. 4B. The second sub-sealing layer 133 may be formed by, for example, a CVD method or a spin-on-dielectric (SOD) method. In particular, the second sub-sealing layer 133 may be formed of a molecular layer consisting of a bilayer or more. The first and second sub-sealing layers 131 and 133 may include silicon oxide or silicon carbonitride. In an embodiment, a thickness d of a sealing layer 135 including the first and second sub-sealing layers 131 and 133 may be about 2 nm.

According to embodiments of the inventive concepts, the first precursor of the first sealing process may have the relatively enlarged molecular structure, so it is possible to inhibit the first precursor from permeating into the second pores P2 exposed by the opening 120. Meanwhile, if a sealing layer is formed using only a precursor having a great molecular size, it may be difficult to form a dense sealing layer. Thus, a surface roughness of the sealing layer may become worse. The sealing layer having the worse surface roughness may have a bad effect on uniformity and continuous deposition of a barrier layer to be formed by a subsequent process. However, according to embodiments of the inventive concepts, the second sub-sealing layer 133 covering the first sub-sealing layer 131 may be formed using the second precursor of which the molecular structure is smaller than that of the first precursor. Since the molecular structure of the second precursor is smaller than that of the first precursor, the second sub-sealing layer 133 formed using the second precursor may become denser. Thus, the surface roughness of the sealing layer 135 may be improved. As a result, the sealing layer 135 with the improved surface roughness may improve characteristics (e.g., uniformity) of the barrier layer.

Figure 5A:
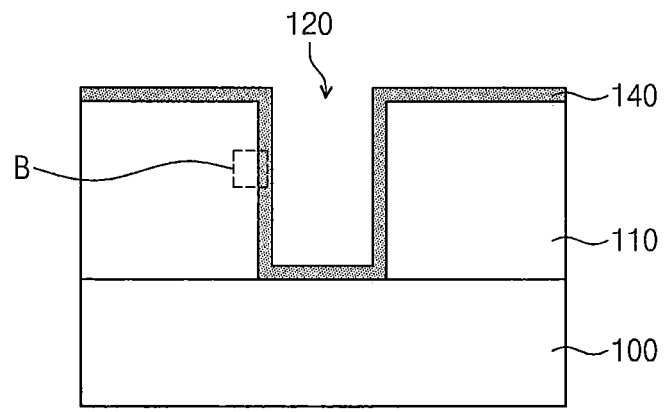
Figure 5B:
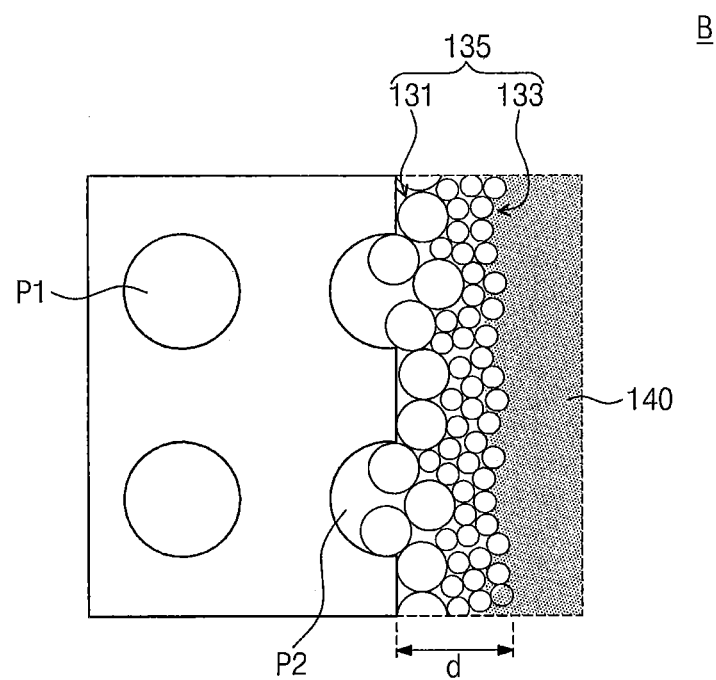
FIG. 5B is an enlarged view of a portion 'B' of FIG. 5A.

Next, referring to FIGS. 1, 5A, and 5B, a barrier layer 140 may be formed in the opening 120 having the sealing layer 135 (S50). The barrier layer 140 may be substantially conformally formed along a profile of the porous dielectric layer 110 having the opening 120. The barrier layer 140 may be a metal barrier layer. The metal barrier layer may include at least one of tantalum, tantalum nitride, ruthenium, cobalt, manganese, titanium, titanium nitride, tungsten nitride, nickel, or nickel fluoride. In an embodiment, the barrier layer 140 may be a bilayer consisting of the metal barrier layer and a seed layer disposed on the metal barrier layer. The seed layer may include, for example, copper. The barrier layer 140 may be formed by, for example, a CVD process, an atomic layer deposition (ALD) process, or a physical vapor deposition (PVD) process.

Figure 6:
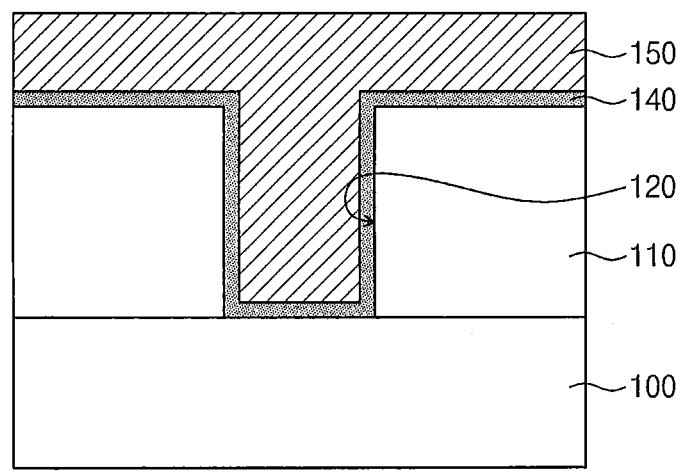
Figure 7:
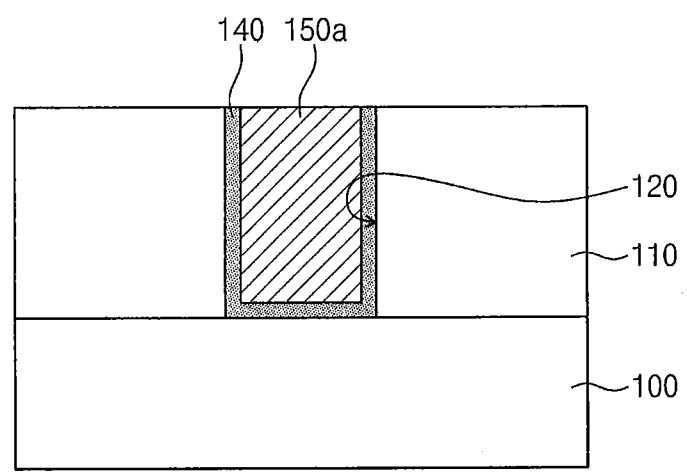

Referring to FIGS. 1, 6, and 7, a conductive pattern 150a may be formed in the opening 120 having the barrier layer 140 (S60).

As illustrated in FIG. 6, a conductive layer 150 filling the opening 120 may be first formed on the substrate 100 having the barrier layer 140. The conductive layer 150 may include tungsten or copper. The barrier layer 140 may prevent a metal element of the conductive pattern 150a from being diffused into the substrate 100 and/or the porous dielectric layer 110.

If the conductive layer 150 includes tungsten, the barrier layer 140 may be the metal barrier layer. The metal barrier layer may include at least one of tantalum, tantalum nitride, ruthenium, cobalt, manganese, titanium, titanium nitride, tungsten nitride, nickel, or nickel fluoride. If the conductive layer 150 includes tungsten, the conductive layer 150 may be formed by a PVD process or a CVD process.

If the conductive layer 150 includes copper, the barrier layer 140 may be the bilayer consisting of the metal barrier layer and the seed layer. If the conductive layer 150 includes copper, the conductive layer 150 may be formed by an electroplating process.

Subsequently, the conductive layer 150 and the barrier layer 140 may be planarized until the porous dielectric layer 110 is exposed, as illustrated in FIG. 7. Thus, the conductive pattern 150a may be formed in the opening 120. The conductive pattern 150a may be electrically connected to the transistors and/or the memory cells disposed within the substrate 100.

According to the method of fabricating the semiconductor device described above, the sealing layer 135 formed by the two sealing processes may have the excellent surface roughness. Thus, the barrier layer 140 may be uniformly and continuously formed on the sealing layer 135. The uniform and continuous barrier layer 140 may improve a gap-fill characteristic of the conductive layer 150 filling the opening 120. As a result, semiconductor device with improved electrical characteristics may be fabricated.

Figure 8:
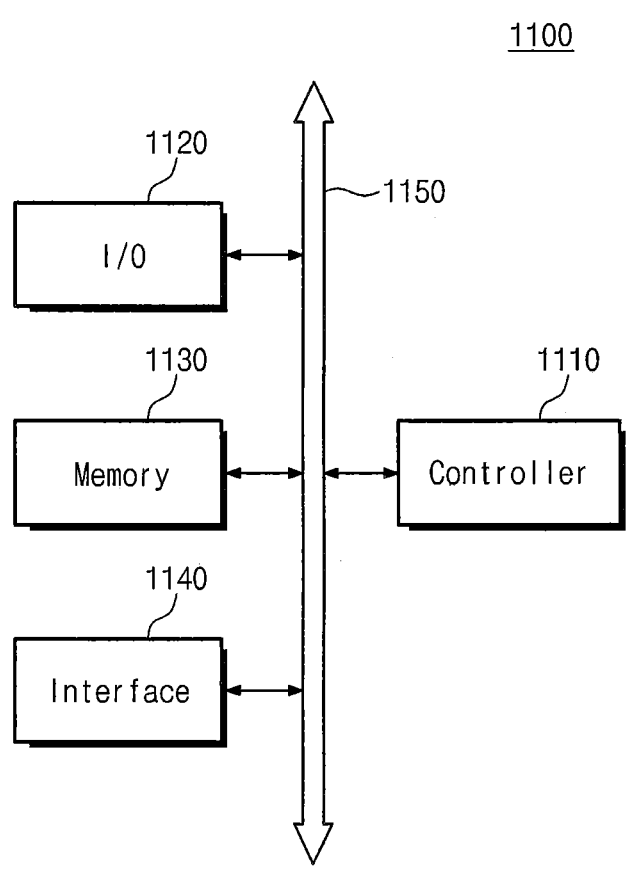
FIG. 8 is a schematic block diagram illustrating an electronic system including a semiconductor device according to embodiments of the inventive concepts.

FIG. 8 is a schematic block diagram illustrating an electronic system including a semiconductor device according to embodiments of the inventive concepts.

Referring to FIG. 8, an electronic system 1100 according to an embodiment of the inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which data are transmitted.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. Although not shown in the drawings, the electronic system 1100 may further include a fast DRAM device and/or a fast SRAM device which acts as a cache memory for improving an operation of the controller 1110. The semiconductor device according to the above embodiments of the inventive concepts may be provided into the memory device 1130, the controller 1110, and/or the I/O unit 1120.

The electronic system 1100 may be applied to a personal digital assistant (PDA), a portable computer, a web tablet, a wireless phone, a mobile phone, a digital music player, a memory card, or other electronic products. The other electronic products may receive or transmit information data by wireless.

Figure 9:
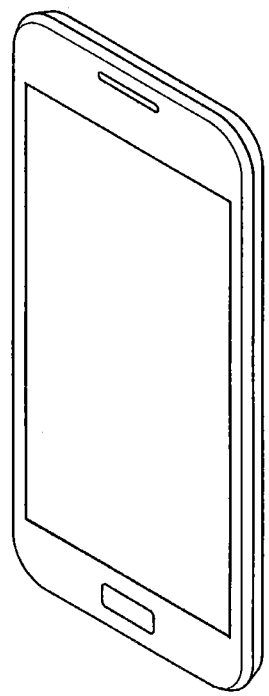
FIG. 9 illustrates a mobile phone including a semiconductor device according to embodiments of the inventive concepts.

The electronic system 1100 of FIG. 8 may be applied to electronic control devices of various electronic devices. FIG. 9 illustrates a mobile phone 1200 implemented with the electronic system 1100 of FIG. 8. In other embodiments, the electronic system 1100 of FIG. 8 may be applied to a portable notebook, a MP3 player, a navigation device, a solid state disk (SSD), a car, or household appliances.

According to embodiments of the inventive concepts, the pre-treatment process may be performed before the sealing process. The pre-treatment process may remove the water molecules and/or the residue of the surface and/or the inside of the porous dielectric layer. As a result, the dielectric constant of the porous dielectric layer may be reduced.

In addition, the sealing layer formed by the two sealing processes may have the excellent surface roughness, so the barrier layer may be uniformly and continuously formed on the sealing layer. The uniform and continuous barrier layer may improve the gap-fill characteristic of the conductive layer filling the opening.

As a result, the semiconductor device with the improved electrical characteristics may be fabricated.

While example embodiments of the inventive concepts have been particularly shown and described, it will be understood by one of ordinary skill in the art that variations in form and detail may be made therein without departing from the spirit and scope of the attached claims.

What is claimed is:

1. A method of treating a porous dielectric layer, the method comprising:
    providing a substrate including the porous dielectric layer having an opening, the porous dielectric layer including a plurality of pores exposed by the opening;
    supplying a first precursor onto the substrate to form a first sub-sealing layer sealing the exposed plurality of pores; and
    supplying a second precursor onto the first sub-sealing layer to form a second sub-sealing layer covering the first sub-sealing layer,
    wherein the first precursor includes a cyclosilazane-based material or a cyclosiloxane-based material and the second precursor includes a silane-based material, and
    wherein the second precursor has a molecular weight that is smaller than the molecular weight of the first precursor.

2. The method of claim 1, wherein when the first precursor includes the cyclosilazane-based material, the first precursor includes a material expressed by the following chemical formula 1

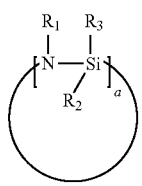

[Chemical formula 1]

wherein "a" denotes an integer of 3 or 4, "R1" denotes hydrogen or a methyl group, and each of "R2" and "R3" independently denotes any one of an alkyl group having a carbon number of 1 to 6, an alkene group having a carbon number of 1 to 6, and an aryl group having a carbon number of 1 to 6.

3. The method of claim 2, wherein the cyclosilazane-based material includes hexamethyl-cyclotrisilazane, octamethyl-cyclotetrasilazane, tetramethyl-tetravinyl-cyclotetrasilazane, or hexaphenyl-cyclotrisilazane.

4. The method of claim 1, wherein when the first precursor includes the cyclosiloxane-based material, the first precursor includes a material expressed by the following chemical formula 2

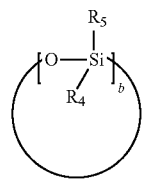

[Chemical formula 2]

wherein "b" denotes an integer of 3 or 4, and each of "R4" and "R5" independently denotes any one of an alkyl group having a carbon number of 1 to 6, an alkene group having a carbon number of 1 to 6, and an aryl group having a carbon number of 1 to 6.

5. The method of claim 4, wherein the cyclosiloxane-based material includes octamethyl-cyclotetrasiloxane, tetramethyl-tetraphenyl-cyclotetrasiloxane, or octaphenyl-cyclotetrasiloxane.

6. The method of claim 1, wherein the silane-based material includes at least one of silane, disilane, methylsilane, dimethylsilane, trimethylsilane, or tetramethylsilane.

7. The method of claim 1, wherein the first precursor has a molecular weight in a range of 200 to 800 Daltons, and
    wherein the second precursor has a molecular weight of 100 Daltons or less.

8. The method of claim 1, wherein the second precursor is supplied by decomposing the first precursor.

9. The method of claim 1, further comprising:
    performing a pre-treatment process on the substrate before the formation of the first sub-sealing layer,
    wherein performing the pre-treatment process comprises:
        supplying a hydrogen-containing gas onto the substrate; and
        irradiating ultraviolet (UV) light onto the substrate.

10. A method of fabricating a semiconductor device, the method comprising:
    forming a porous dielectric layer having an opening on a substrate;
    forming a sealing layer in the opening; and
    forming a barrier layer in the opening having the sealing layer,
    wherein forming the sealing layer comprises:
        performing a first sealing process using a first precursor on the substrate; and
        performing a second sealing process using a second precursor on the substrate after performing the first sealing process,
        wherein the first precursor includes a cyclosilazane-based material or a cyclosiloxane-based material, and
        wherein the second precursor includes a silicon-containing precursor having a molecular weight that is smaller than that of the first precursor.

11. The method of claim 10, wherein the cyclosilazane-based material includes hexamethyl-cyclotrisilazane, octamethyl-cyclotetrasilazane, tetramethyl-tetravinyl-cyclotetrasilazane, or hexaphenyl-cyclotrisilazane, and
    wherein the cyclosiloxane-based material includes octamethyl-cyclotetrasiloxane, tetramethyl-tetraphenyl-cyclotetrasiloxane, or octaphenyl-cyclotetrasiloxane.

12. The method of claim 10, wherein the silicon-containing precursor includes a precursor formed by decomposing the cyclosilazane-based material or a precursor formed by decomposing the cyclosiloxane-based material.

13. The method of claim 10, wherein the first precursor has a molecular weight in a range of 200 to 800 Daltons, and
wherein the second precursor has a molecular weight of 100 Daltons or less.

14. The method of claim 10, wherein the porous dielectric layer includes a plurality of pores exposed by the opening, wherein the sealing layer comprises:
a first sub-sealing layer sealing the exposed plurality of pores; and
a second sub-sealing layer covering the first sub-sealing layer,
wherein the first sub-sealing layer is formed by the first sealing process, and
wherein the second sub-sealing layer is formed by the second sealing process.

15. The method of claim 10, further comprising:
performing a pre-treatment process on the substrate before performing the first sealing process,
wherein performing the pre-treatment process comprises:
supplying a hydrogen-containing gas onto the substrate; and
irradiating ultraviolet (UV) light onto the substrate
wherein the pre-treatment process, the first sealing process, and the second sealing process are performed in-situ in a same chamber.

16. A method of fabricating a semiconductor device, the method comprising:
providing a substrate including a porous dielectric layer having an opening;
performing a first sealing process on the substrate using a first precursor; and
performing a second sealing process on the substrate using a second precursor,
wherein the first precursor includes a cyclosilazane-based material or a cyclosiloxane-based material and has a molecular weight in a range of about 200 to about 800 Daltons, and
wherein the second precursor includes a silane-based material and has a molecular weight that is smaller than that of the first precursor.

17. The method of claim 16, wherein the first precursor includes hexamethyl-cyclotrisilazane, octamethyl-cyclotetrasilazane, tetramethyl-tetravinyl-cyclotetrasilazane, hexaphenyl-cyclotrisilazane, octamethyl-cyclotetrasiloxane, tetramethyl-tetraphenyl-cyclotetrasiloxane, or octaphenyl-cyclotetrasiloxane, and
wherein the second precursor includes one or more of silane, disilane, methylsilane, dimethylsilane, trimethylsilane, and/or tetramethylsilane.

18. The method of claim 16, wherein the performing the second sealing process comprises decomposing the first precursor using ultraviolet (UV) light or plasma power, and
wherein the second precursor includes the decomposed first precursor.

19. The method of claim 16, further comprising:
performing a pre-treatment process on the substrate before performing the first sealing process,
wherein performing the pre-treatment process comprises:
supplying a hydrogen-containing gas onto the substrate; and
irradiating ultraviolet (UV) light onto the substrate
wherein the pre-treatment process, the first sealing process, and the second sealing process are performed in-situ in a same chamber.

* * * * *